US008446015B2

(12) United States Patent
Masuda et al.

(10) Patent No.: US 8,446,015 B2
(45) Date of Patent: May 21, 2013

(54) SEMICONDUCTOR DEVICE AND METHOD FOR MANUFACTURING THEREOF

(75) Inventors: Naomi Masuda, Yokohama (JP); Kouichi Meguro, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 52 days.

(21) Appl. No.: 13/015,072

(22) Filed: Jan. 27, 2011

(65) Prior Publication Data

US 2012/0049362 A1 Mar. 1, 2012

Related U.S. Application Data

(62) Division of application No. 12/165,331, filed on Jun. 30, 2008, now Pat. No. 7,892,892.

(30) Foreign Application Priority Data

Jul. 2, 2007 (JP) ................. 2007-174660

(51) Int. Cl.
*H01L 23/52* (2006.01)
*H01L 23/48* (2006.01)
*H01L 29/40* (2006.01)

(52) U.S. Cl.
USPC ............ 257/777; 257/E21.614; 257/685; 257/686; 438/108; 438/109; 361/760

(58) Field of Classification Search
USPC .............. 257/E23.01, E23.024, E23.069, 257/659, 666, 685, 686, 706, 707, 723, 737, 257/738, 777, 778, 787; 438/106, 110, 112, 438/124, 127, 108, 109; 361/760
See application file for complete search history.

(56) References Cited

U.S. PATENT DOCUMENTS

| | | | | |
|---|---|---|---|---|
| 4,005,472 A * | 1/1977 | Harris et al. | ............ | 257/737 |
| 5,045,914 A | 9/1991 | Casto et al. | | |
| 5,608,265 A * | 3/1997 | Kitano et al. | ............ | 257/738 |
| 5,856,212 A * | 1/1999 | Chun | ............ | 438/126 |
| 5,973,393 A * | 10/1999 | Chia et al. | ............ | 257/690 |
| 6,187,612 B1 | 2/2001 | Orcutt | | |
| 6,528,348 B2 * | 3/2003 | Ando et al. | ............ | 438/109 |
| 6,534,337 B1 * | 3/2003 | Mahle et al. | ............ | 438/106 |
| 6,614,104 B2 * | 9/2003 | Farnworth et al. | ............ | 257/686 |
| 6,831,354 B2 * | 12/2004 | Terui et al. | ............ | 257/678 |
| 6,847,109 B2 * | 1/2005 | Shim | ............ | 257/697 |
| 6,894,378 B2 | 5/2005 | Winderl | | |
| 7,667,338 B2 * | 2/2010 | Lin et al. | ............ | 257/787 |
| 7,763,493 B2 * | 7/2010 | Tay et al. | ............ | 438/106 |
| 7,791,206 B2 * | 9/2010 | Takeuchi et al. | ............ | 257/774 |
| 2001/0026010 A1 | 10/2001 | Horiuchi et al. | | |
| 2004/0084771 A1 * | 5/2004 | Bolken et al. | ............ | 257/738 |
| 2005/0224949 A1 * | 10/2005 | Nemoto | ............ | 257/690 |

* cited by examiner

*Primary Examiner* — Chris Chu (57) ABSTRACT

A semiconductor device has a first semiconductor chip 10 molded with a resin 12, a first metal 14 provided in the resin 12 in a circumference of the first semiconductor chip 10, and being exposed on a lower surface of the resin 12, a second metal 16 provided in the resin 12 over the first metal 14, and being exposed on an upper surface of the resin 12, and a first wire 18 coupling the first semiconductor chip 10 to the first metal 14 and the second metal 16. The first wire 18 is coupled to the first metal 14 and the second metal 16 so as to be sandwiched therebetween.

11 Claims, 13 Drawing Sheets

SEMICONDUCTOR DEVICE AND METHOD FOR MANUFACTURING THEREOF

CROSS-REFERENCE TO RELATED APPLICATIONS

This application is a Divisional of U.S. patent application Ser. No. 12/165,331, filed Jun. 30, 2008, which is based on Japanese Patent Application No. 2007-174660 filed on Jul. 2, 2007, the disclosure of which is hereby incorporated by reference.

TECHNICAL FIELD

The present invention relates to a semiconductor device and a method for manufacturing the same and, more particularly, to a stackable semiconductor device and a method for manufacturing the same.

BACKGROUND OF THE INVENTION

In recent years, miniaturization is required for semiconductor devices which are used as non-volatile storage mediums in, for example, portable electronic devices such as a mobile telephones and integrated circuit memories. For that purpose, a technology to efficiently package a semiconductor chip is required and one such technique to stack semiconductor devices, a package-on-package (pop) technology which has a semiconductor chip mounted on one or more other semiconductor chips, has been developed.

Disclosed in Japanese Patent Application Publication No. JP-A-2003-60121, as a method for manufacturing a semiconductor device, a solder ball is provided on a lower die in a circumference of a semiconductor chip and, as for the solder ball to be pressed via a lead frame, an upper die is joined together. Thereafter, the semiconductor chip, the lead frame and the solder bait are molded to complete the disclosed method for manufacturing the semiconductor device having a part of the solder ball being exposed.

In a semiconductor device having a semiconductor chip mounted, a cost reduction is a consistent issue. For example, in the semiconductor device described in JP-A-2003-60121, a lead frame is used for an internal wiring of the semiconductor device. Further, in a semiconductor device in related art, other than a lead flume, a wiring substrate and such are used. These lead frames, wiring substrates and such are particularly expensive among the materials used for the semiconductor device and occupy a substantial portion of the material cost of the semiconductor device.

Particularly, when stacking semiconductor devices, as lead frames, wiring substrates and such are used in each of the semiconductor devices prior to be stacked, if the number of stacking semiconductor devices is increased, a cost increase is undeniable.

SUMMARY OF THE INVENTION

The present invention has been made in view of the above circumstances, and has an object to provide a semiconductor device which can promote a cost reduction and a method for manufacturing the same.

A semiconductor device according to an aspect of the present invention includes: a first semiconductor chip molded with a resin; a first metal provided in the resin in a circumference of the first semiconductor chip, and being exposed on a lower surface of the resin; a second metal provided in the resin over the first metal, and being exposed on an upper surface of the resin; and a first wire coupling the first semiconductor chip to the first metal and the second metal. The first wire is coupled to the first metal and the second metal so as to be sandwiched therebetween. According to this aspect of the present invention, a semiconductor device having a first semiconductor chip packaged can be made without using lead frames or wiring substrates. Accordingly, a cost reduction of a semiconductor device can be promoted.

A method for manufacturing a semiconductor device according to another aspect of the present invention includes: forming a plurality of first metals on a first support; mounting a plurality of first semiconductor chips on the first support so as to be adjacent to some of the plurality of first metals; coupling adjacent first semiconductor chips among the plurality of first semiconductor chips to each other with a first wire over the first metals; forming a plurality of second metals on a second support; joining the first support and the second support by respectively coupling the plurality of first metals and the plurality of second metals to each other so as to sandwich the first wire; forming a resin that molds the plurality of first semiconductor chips by filling an area between the first support and the second support with resin; peeling off the first support and the second support from the resin; and cutting the resin so as include the first semiconductor chip. According to this aspect of the present invention, a semiconductor device having a first semiconductor chip packaged can be made without using lead frames or wiring substrates. Accordingly, a cost reduction of a semiconductor device can be promoted.

DETAILED DESCRIPTION

Hereafter, with reference to drawings, embodiments of the present invention will be described.

First Embodiment

Figure 1A:
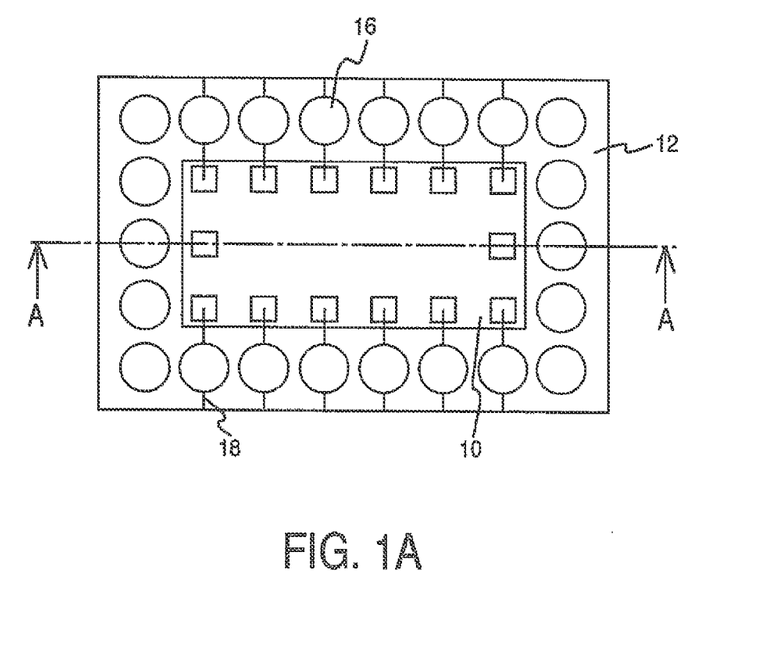
FIG. 1A is a top view of a semiconductor device of a first embodiment of the present invention and FIG. 1B is a cross-sectional view taken along the line A-A in FIG. 1A.
Figure 1B:
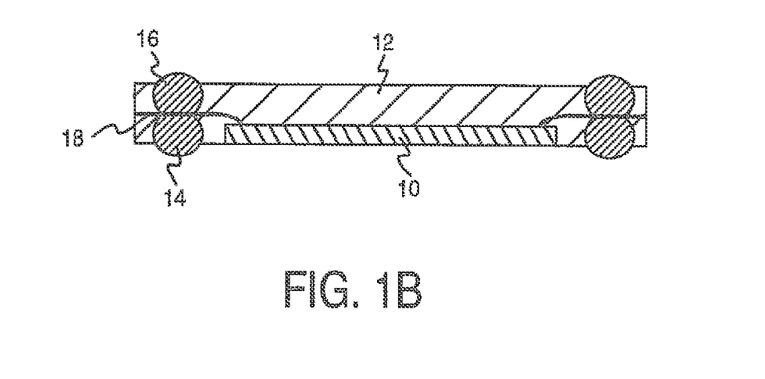

FIG. 1A is a top view of a semiconductor device of a first embodiment of the present invention and FIG. 1B is a cross-sectional view taken along the line A-A in FIG. 1A. In FIG. 1A, a first semiconductor chip 10 and such are shown viewed through a resin 12. In reference to FIGS. 1A and 1B, with the resin 12 made of, for example an epoxy resin, the first semiconductor chip 10 is being molded. In the resin 12 in a circumference of the first semiconductor chip 10, a first metal 14 exposed on a lower surface of the resin 12 is provided. On the resin 12 over the first metal 14, exposed on an upper surface of the resin 12, a second metal 16 which is electrically coupled to the first metal 14 is provided. More specifically, the first metal 14 and the second metal 16 are surrounded by the resin part of the first metal 14 is being exposed on the lower surface of the resin 12, and a part of the second metal 16 is being exposed on the upper surface of the resin 12. The first metal 14 and the second metal 16 are in a spherical shape, and a material of, for example, a copper (Cu) ball plated with gold (Au) can be used. A first wire 18 which electrically couples the first semiconductor chip 10 to the first metal 14 and the second metal 16 and is made of, for example, Au is being coupled to the first metal 14 and the second metal 16 so as to be sandwiched therebetween.

Next, with reference to FIGS. 2A to 8B, a method for manufacturing the semiconductor device of the first embodiment will be described. FIGS. 2A, 3A, 4A, 5A, 6A, 7A and 8A are top views and FIGS. 2B, 3B, 4B, 5B, 6B, 7B and 8B are cross-sectional views taken along the lines A-A in respective FIGS. 2A, 3A, 4A, 5A, 6A, 7A and 8A.

Figure 2A:
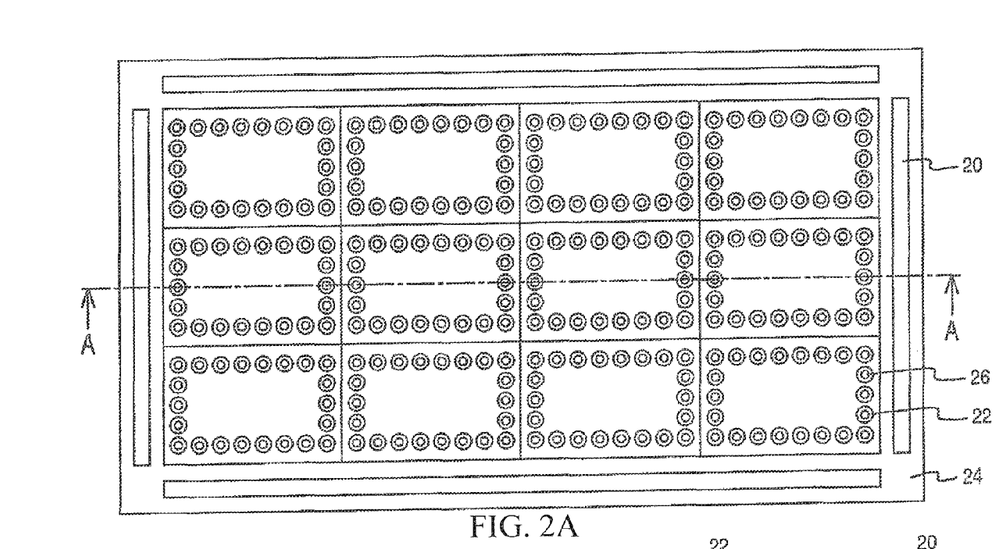
FIG. 2A is a top view (part 1) showing a method for manufacturing the semiconductor device of the first embodiment and FIG. 2B is a cross-sectional view (part 1)
Figure 2B:
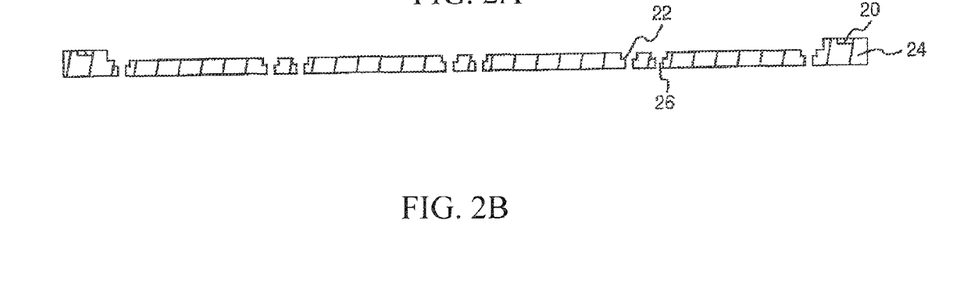
Figure 3A:
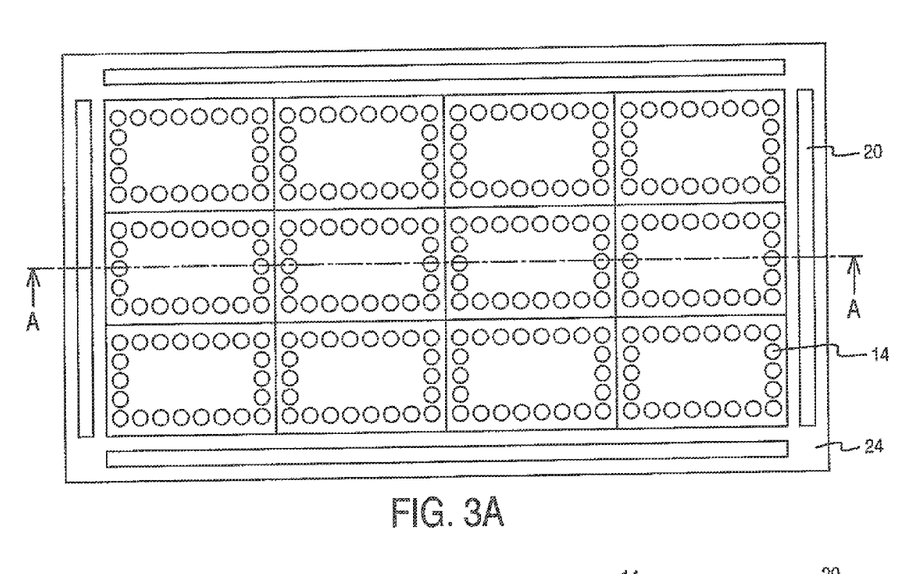
FIG. 3A is a top view (part 2) showing the method for manufacturing the semiconductor device of the first embodiment and FIG. 3B is a cross-sectional view 2)
Figure 3B:
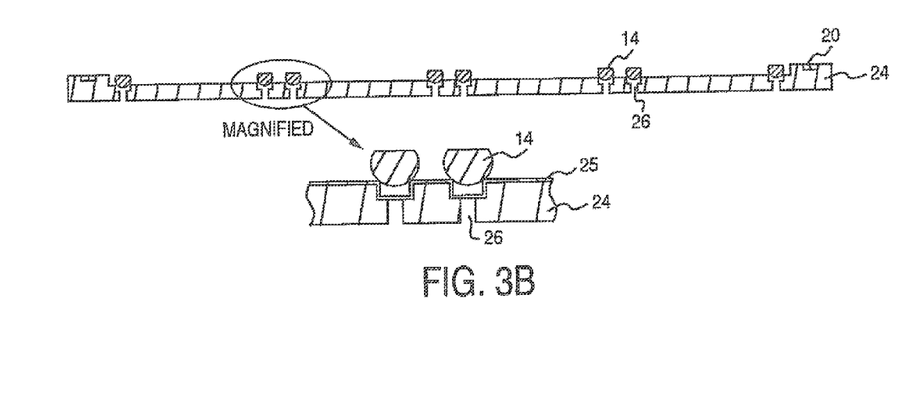

In reference to FIGS. 2A and 2B, a first support 24 made of, for example, metal having a plurality of recesses 22 provided with a first through-hole 26 which runs through the first support 24 is prepared. In a circumference of the first support 24, a first conductor 20 made of, for example, Cu is formed. In reference to FIGS. 3A and 3B, so as to cover an upper surface of the first support 24, a first film 25 made of, for example, a fluorine resin is formed. Sandwiching the first film 25, the first metal 14 is pressed into the plurality of recesses 22. A flat material, for example, is pressed against the top part of the first metal 14 to planarize the top part of the first metal 14. In FIGS. 4 and 5, the first film 25 is omitted from the drawing.

Figure 4A:
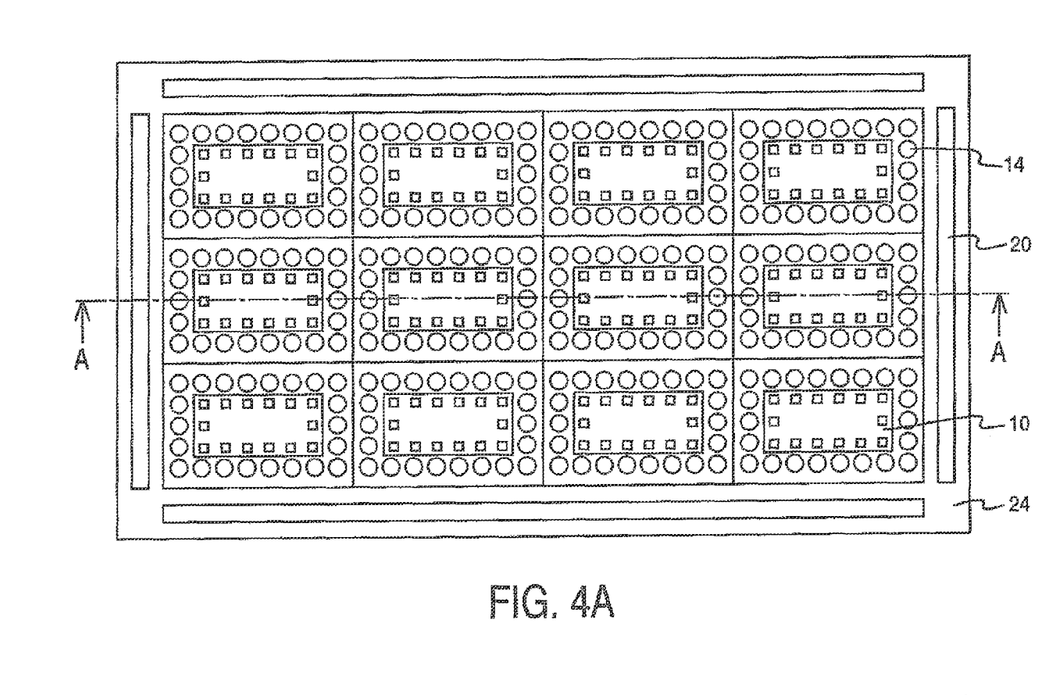
FIG. 4A is a top view (part 3) showing the method for manufacturing the semiconductor device of the first embodiment and FIG. 4B is a cross-sectional view (part 3)
Figure 4B:
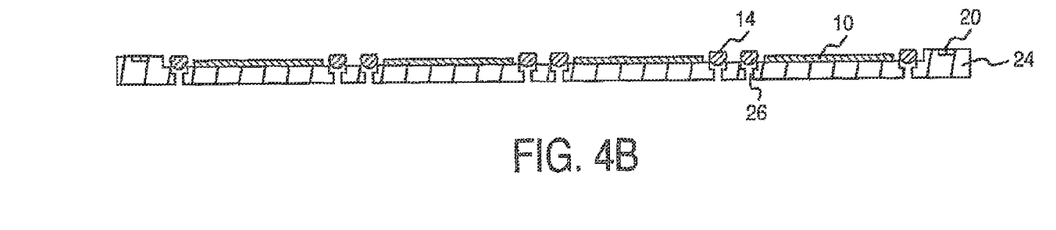

In reference to FIGS. 4A and 4B, on the first film 25 which covers the upper surface of the first support 24, a plurality of first semiconductor chips 10 are mounted so as to be surrounded by the first metals 14. For the mounting of the first semiconductor chip 10, a thermosetting adhesive, a thermoplastic adhesive, and such can be used.

Figure 5A:
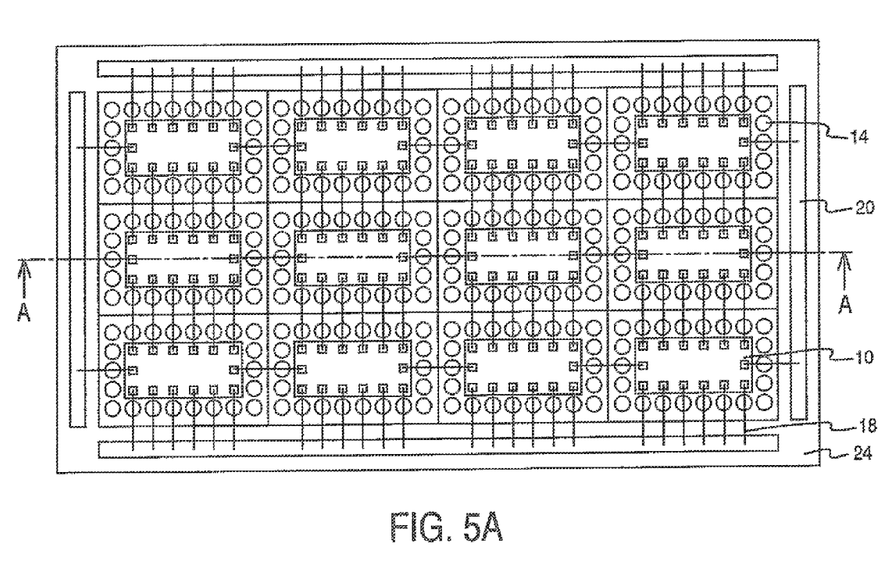
FIG. 5A is a top view (part 4) showing the method for manufacturing the semiconductor device of the first embodiment and FIG. 5B is a cross-sectional view (part 4)
Figure 5B:
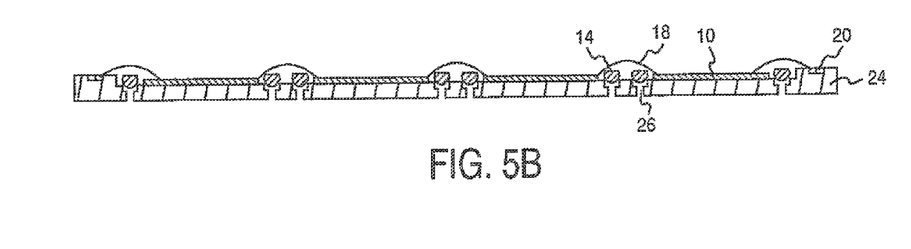

In reference to FIGS. 5A and 5B, over the first metal 14, the adjacent first semiconductor chips 10 are coupled to each other with the first wire 18. The first semiconductor chip 10 mounted in an outermost circumference of the first support 24 out of the plurality of first semiconductor chips 10 mounted, more specifically, the first semiconductor chip 10 adjacent to the first conductor 20 is coupled to the first conductor 20 with the first wire 18 over the first metal 14.

Figure 6A:
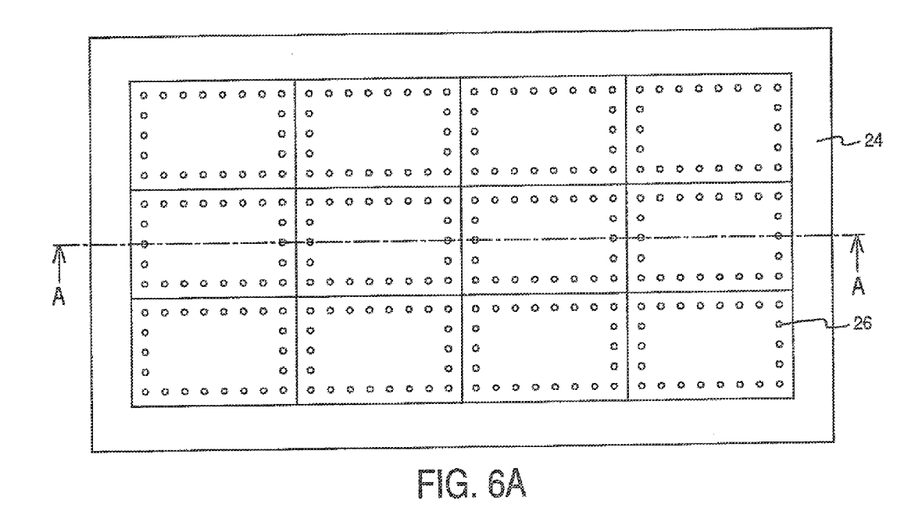
FIG. 6A is a top view (part 5) showing the method for manufacturing the semiconductor device of the first embodiment and FIG. 6B is a cross-sectional view (part 5)
Figure 6B:
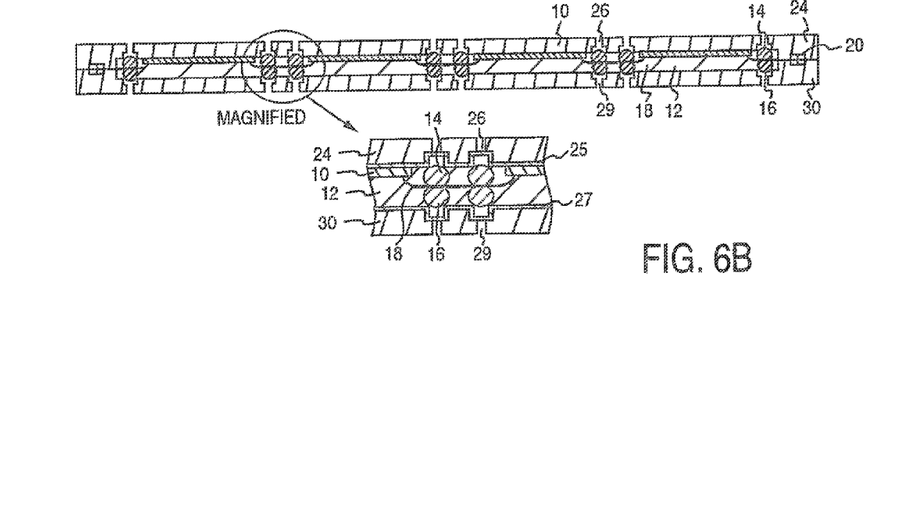

In reference to FIGS. 6A and 6B, carrying out similar processes to those manufacturing processes shown in FIGS. 2A to 3B, a second support 30 which is formed by pressing a second metal 16 into a plurality of recesses 22 sandwiching a second film 27 made of, for example, a fluorine resin is prepared. In the second support 30, a second through-hole 29 which runs through the second support 30 is provided and the top part of the second metal 16 is, as similar to that of the first metal 14, being planarized. The first metal 14 and the second metal 16 are coupled to each other so as to sandwich the first wire 18, and the first support 24 and the second support 30 are joined together. In between the first support 24 and the second support 30, a resin is impregnated at and the resin 12 which molds the first semiconductor chip 10 is formed.

Figure 7A:
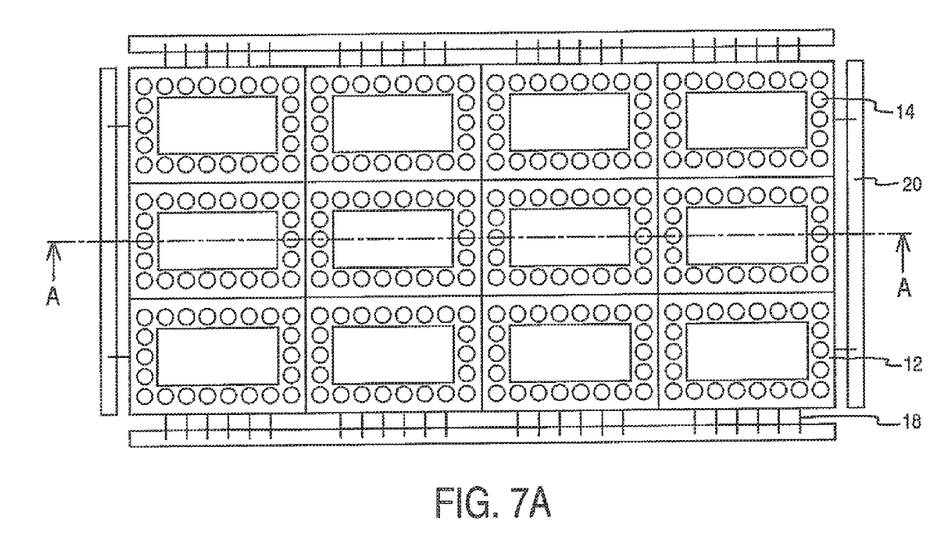
FIG. 7A is a top view (part 6) showing the method for manufacturing the semiconductor device of the first embodiment and FIG. 7B is a cross-sectional view (part 6)
Figure 7B:
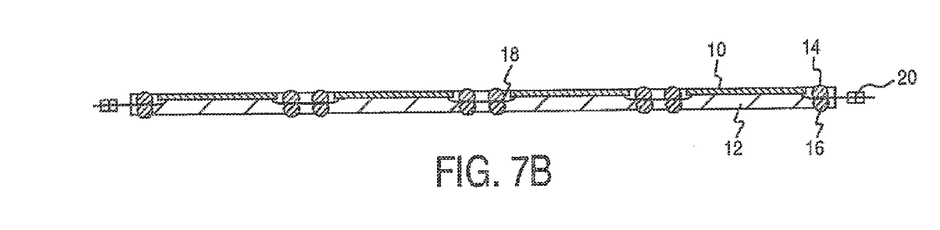

In reference to FIGS. 7A and 7B, while pumping in a compressed air through the first through-hole 26 provided on the first support 24 and through the second through-hole 29 provided on the second support 30, the first support 24 is peeled off from the first film 25 and the second support 30 is peeled off from the second film 27. More specifically, the first support 24 and the second support 30 are peeled off from the resin 12. Thereafter, the first film 25 and the second film 27 are peeled off from the resin 12. In reference to FIGS. 8A and 8B, by cutting off the resin 12 at a predefined position using, for example a dicing method, the plurality of first semiconductor chips 10 are respectively diced. Consequently, the semiconductor device of the first embodiment is completed.

According to the first embodiment, as shown in FIGS. 1A and 1B, the first semiconductor chip 10 is molded with the resin 12 and, in the resin 12 in the circumference of the first semiconductor chip 10, the first metal 14 exposed on the lower surface of the resin 12 and the second metal 16 exposed on the upper surface of the resin 12 are provided. Further, with the first wire 18 coupled to the first metal 14 and the second metal 16 being sandwiched therebetween, the first semiconductor chip 10 is electrically coupled to the first metal 14 and the second metal 16. Therefore, the first semiconductor chip 10, via the first metal 14 and the second metal 16, can be electrically coupled to the outside. Further, the first semiconductor chip 10 is packaged without using wiring substrates and lead frames which are of expensive materials. Consequently, a cost reduction of a semiconductor device can be promoted. Further, as for the first metal 14 and the second metal 16, as the material of an inexpensive Cu ball plated with Au can be used, a cost reduction of the semiconductor device can be further promoted.

According to the manufacturing method of the first embodiment, as shown in FIGS. 3A, 3B, 6A and 6B, by pressing the first metal 14 into the plurality of recesses 22 provided on the first support 24, the first metal 14 is formed on the first support 24 and, by pressing the second metal 16 into the plurality of recesses 22 provided on the second support 30, the second metal 16 is formed on the second support 30. Consequently; as shown in FIGS. 6A and 6B, when forming the resin 12, the first metal 14 and the second metal 16 which are sufficiently exposed on the resin 12 can be made. Furthermore, the first metal 14 and the second metal 16 can be securely fixed on the first support 24 and on the second support 30.

Further, as shown in FIGS. 3A, 3B, 6A and 6B, the top part of the first metal 14 and the top part of the second metal 16 are being planarized. Therefore, the flat area of the first metal 14 and the second metal 16 can be increased. Consequently, the process shown in reference to FIGS. 6A and 6B to couple the first metal 14 and the second metal 16 to each other so as to sandwich the first wire 18 can be easily carried out. Therefore, the process of planarizing the top part of the first metal 14 is preferable to be carried out prior to coupling the adjacent first semiconductor chips 10 to each other with the first wire 18 over the first metal 14, and the process of planarizing the top part of the second metal 16 is preferable to be carried out prior to joining the first support 24 and the second support 30 together.

Further, as shown in FIGS. 3A, 3B, 6A and 6B, the first metal 14 is formed on the first support 24 sandwiching the first film 25 and the second metal 16 is formed on the second support 30 sandwiching the second film 27. The first film 25 and the first support 24 as well as the second film 27 and the second support 30 have superior mold releasability. Therefore, as shown in FIGS. 7A and 7B, when peeling off the first support 24 and the second support 30 from the resin 12, as compared with the case where the first support 24 and the second support 30 are directly joined to the resin 12, the first support 24 and the second support 30 can be easily peeled off from the resin 12. Furthermore, even when either one of the first film 25 or the second film 27 is provided, an easiness of peeling off the first support 24 and the second support 30 from the resin 12 can be improved.

Particularly, as shown in FIGS. 3A, 3B, 6A and 6B, when pressing the first metal 14 into the recess 22 provided on the first support 24 sandwiching the first film 25 and when pressing the second metal 16 into the recess 22 provided on the second support 30 sandwiching the second film 27, as the thickness of the first film 25 and the second film 27 serves as a buffer, a tolerable variation range of diameters of the first metal 14 and the second metal 16 can be made large.

Further, as shown in FIGS. 2A, 2B, 6A and 6B, the first through-hole 26 which runs through the first support 24 is provided on the first support 24 and the second through-hole 29 which runs through the second support 30 is provided on the second support 30. Therefore, as shown in FIGS. 7A and 7B, while pumping in the compressed air through the first through-hole 26 and through the second through-hole 29, the first support 24 and the second support 30 can be peeled off from the resin 12. Consequently, peeling off the first support 24 and the second support 30 from the resin 12 can be easily carried out. Meanwhile, the gas pumped in through the first through-hole 26 and the second through-hole 29 is not limited to a compressed air, and other gases such as nitrogen may be used. Furthermore, even when either one of the first through-hole 26 or the second through-hole 29 is provided, an easiness of peeling off the first support 24 and the second support 30 from the resin 12 can be improved.

Particularly, in the ease where the first through-hole 26 is formed on the recess 22 provided on the first support 24, prior to mounting the first metal 14, while air is being sucked out through the first through-hole 26 to secure the first film 25 onto the first support 24, the first metal 14 can be mounted under this condition. Further, the diameter of the first through-hole 26 is preferable to be smaller than the thickness of the first film 25. When the diameter of the first through-hole 26 is larger than the thickness of the first film 25, there is a danger of the first film 25 creeping into the first through-hole 26 clogging the first through-hole 26. If the first through-hole 26 is clogged by the first film 25, when peeling off the first support 24 from the resin 12, the gas is not pumped in well and the easiness of peeling off the first support 24 is impaired. Similarly, when the second through-hole 29 is formed an the recess 22 provided on the second support 30, while the second film 27 is being secured on the second support 30, the second metal 16 can be mounted. Furthermore, the diameter of the second through-hole 29 is preferable to be smaller than the thickness of the second film 27.

Further, as shown in FIGS. 2A and 2B, in the circumference of the first support 24, the first conductor 20 is being formed. Therefore, as shown in FIGS. 5A and 5B, the first semiconductor chip 10 mounted in the outermost circumference of the first support 24 out of the plurality of first semiconductor chips 10 mounted, more specifically, the first semiconductor chip 10 adjacent to the first conductor 20 can be coupled to the first conductor 20 with the first wire 18 over the first metal 14. Consequently, the first semiconductor chip 10 in the outermost circumference can also be used.

Further, as shown in FIGS. 7A and 7B, the first support 24 and the second support 30 are taken off from the resin 12. Therefore, the first support 24 and the second support 30 can be repeatedly used. Consequently, a cost reduction of a manufacturing cost can be promoted.

Figure 9:
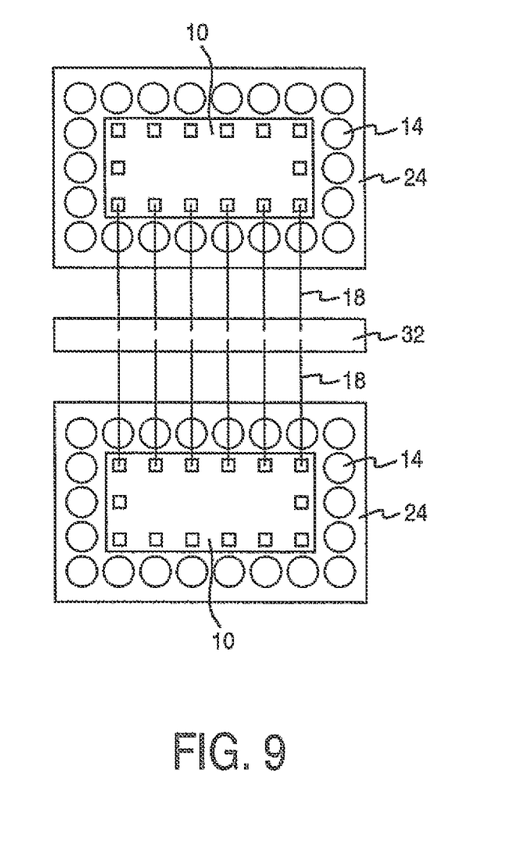
FIG. 9 is an illustration showing when coupling adjacent first semiconductor chips 10 together via a second conductor 32 formed in between the adjacent first semiconductor chips 10.

In the first embodiment, as shown in FIGS. 5A and 5B, the example of directly coupling the adjacent first semiconductor chips 10 to each other with the first wire 18 aver the first metal 14 has been described. However, as shown in FIG. 9, by forming a second conductor 32 between adjacent first semiconductor chips 10, the adjacent first semiconductor chips 10 may be coupled to each other via the second conductor 32. In this case, via the second conductor 32, the adjacent first semiconductor chips 10 can be easily coupled to each other, even when having different wiring patterns.

Furthermore, while the example has been described, in which the first semiconductor chip 10 is mounted on the first support 24 so as to be surrounded by the first metals 14 as shown in FIGS. 4A and 4B, it is not limited to this. As to make the adjacent first semiconductor chips 10 coupled to each other with the first wire 18 over the first metal 14, the first semiconductor chips 10 may be formed as to be adjacent to the first metal 14.

Figure 8A:
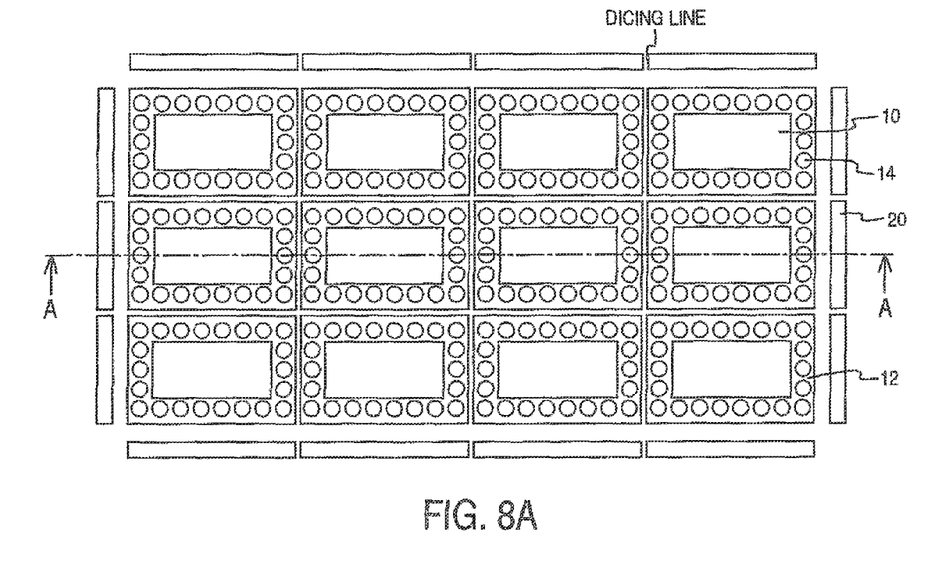
FIG. 8A is a top view (part 7) showing the method for manufacturing the semiconductor device of the first embodiment and FIG. 8B is a cross-sectional view (part 7)
Figure 8B:
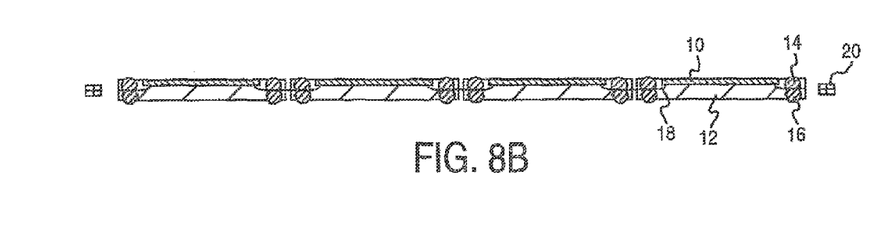

Further, as shown in FIGS. 8A and 8B, while the example of cutting off the resin 12 into a plurality of first semiconductor chips 10 to be respectively diced has been described, it is no limited to this. The resin 12 may be cut off so as to include a plurality of first semiconductor chips 10 such as 2 pieces, 3 pieces, and so on.

Further, while the example of the first metal 14 and the second metal 16 being in a spherical shape has been described, it is not limited to this. However, while the first metal 14 and the second metal 16 are being in a spherical shape, as shown in FIGS. 3A, 3B, 6A and 6B, when mounting the first metal 14 onto the recess 22 provided on the first support 24 and when mounting the second metal 16 onto the recess 22 provided on the second support 30, a tolerable variation range of diameters of the first metal 14 and the second metal 16 can be made large.

Further, while the example of the first film 25 and the second film 27 being made of a fluorine resin has been described, it is not limited to this. As long as the material is superior in terms of mold releasability from the first support 24 and the second support 30, other materials may be used. Furthermore, while the example of mounting the first semiconductor chip 10, using a thermosetting adhesive or a thermoplastic adhesive, on the first film 25 which covers the first support 24 has been described, it is not limited to this. As to make the first film 25 to be easily peeled off from the resin 12, as long as it is a mounting method of a low adhesiveness between the first semiconductor chip 10 and the first film 25, other mounting methods may be used. Further, while the example of the first metal 14 and the second metal 16 using the material of the Cu ball plated with Au has been described, it is not limited to his. The material of a silver (Ag) plated Cu ball, the material of a solder plated Cu ball, and such may be used. Particularly, an inexpensive material is preferable.

Second Embodiment

Figure 10:
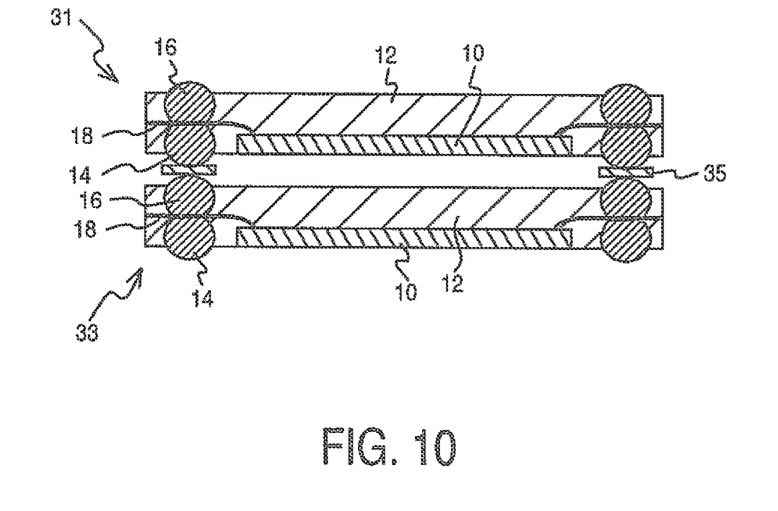
FIG. 10 is a cross-sectional view of a semiconductor device of a second embodiment of the present invention.

A second embodiment of the present invention is an example of stacking the semiconductor devices of the first embodiment. FIG. 10 is a cross-sectional view showing the semiconductor devices of the first embodiment being stacked in package-on-package. In reference to FIG. 10, the first metal 14 exposed on the tower surface of the resin 12 of an upper semiconductor device 31 and the second metal 16 exposed on the upper surface of the resin 12 of a lower semiconductor device 33 are coupled to each other via a solder 35. Therefore, in the semiconductor device of the first embodiment, as the first metal 14 is exposed on the lower surface of the resin 12 and the second metal 16 is exposed on the upper surface of the resin 12, the upper semiconductor device 31 and the lower semiconductor device 33 can be electrically coupled to each other. In FIG. 10, while the example of stacking semiconductor devices in two layers has been described, stacking in layers of three, four, and so on may naturally be possible.

Third Embodiment

Figure 11A:
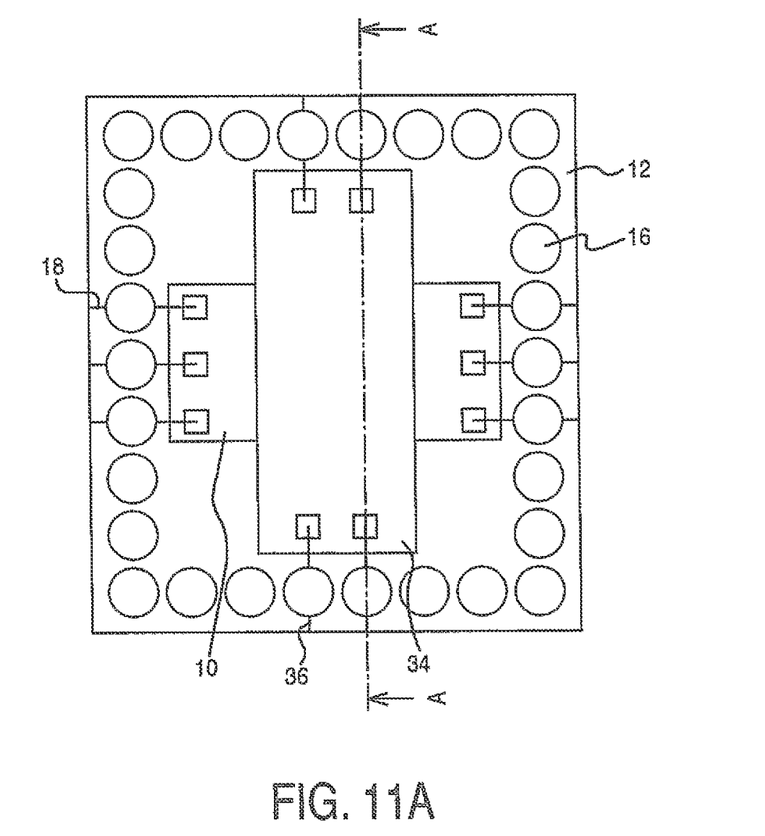
FIG. 11A is a top view of a semiconductor device of a third embodiment of the present invention and FIG. 11B is a cross-sectional view taken along the line A-A in FIG. 11A.
Figure 11B:
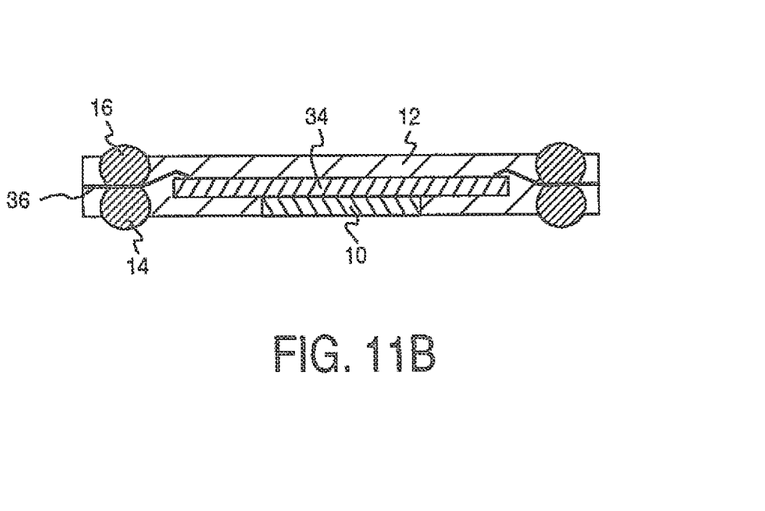

A third embodiment of the present invention is an example of mounting a second semiconductor chip 34 on the first semiconductor chip 10. FIG. 11A is a top view of a semiconductor device of the third embodiment and FIG. 11B is a cross-sectional view taken along the line A-A in FIG. 11A. In FIG. 11A, the first semiconductor chip 10, the second semiconductor chip 34, and such are shown viewed through the resin 12.

In reference to FIGS. 11A and 11B, the second semiconductor chip 34 is provided on the first semiconductor chip 10, and the first semiconductor chip 10 and the second semiconductor chip 34 are molded with the resin 12. A second wire 36 which couples the second semiconductor chip 34 to the first metal 14 and the second metal 16 and is made of, for example, Au is being coupled to the first metal 14 and the second metal 16 so as to be sandwiched therebetween. As other configurations are the same as those of the first embodiment and as shown in FIGS. 1A and 1B, their descriptions are omitted.

According to the third embodiment, the second semiconductor chip 34 is provided on the first semiconductor chip 10, and the second semiconductor chip 34 is being electrically coupled to the first metal 14 and the second metal 16 with the second wire 36 which is coupled to the first metal 14 and the second metal 16 being sandwiched therebetween. Therefore, via the first metal 14 and the second metal 16, the second semiconductor chip 34 can also be electrically coupled to the outside. Consequently, in the third embodiment, as compared with that of the first embodiment, a packaging density of a semiconductor chip can be increased twice as high. Further, as compared with that of the first embodiment, as the number of materials used is not much changed, according to the third embodiment while preventing the number of materials from being increased, the packaging density can be increased twice as high. Consequently, in the third embodiment as compared with the first embodiment, a cost reduction can be further promoted.

Figure 12A:
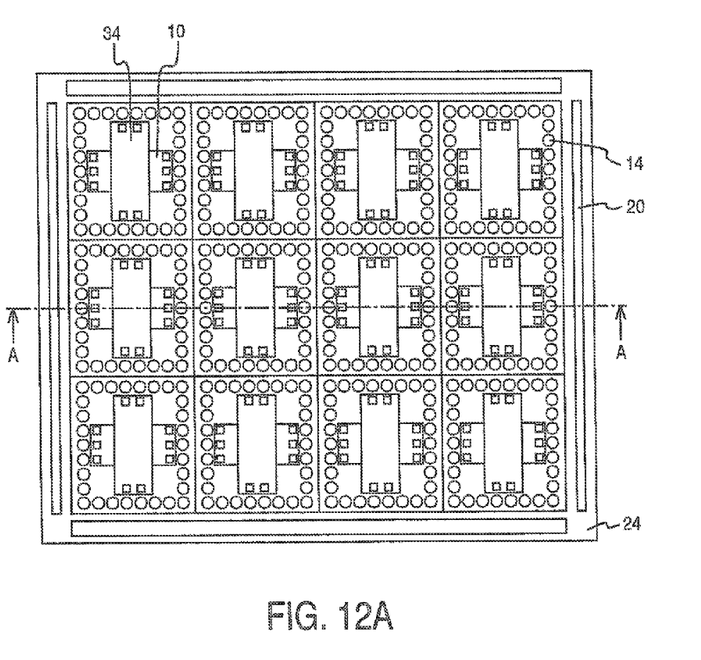
FIG. 12A is a top view (part 1) showing a method for manufacturing the semiconductor device of the third embodiment and FIG. 12B is a cross-sectional view (part 1)
Figure 12B:
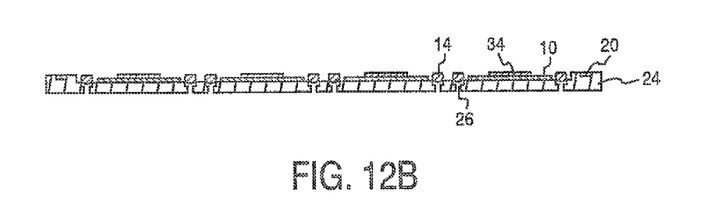
Figure 13A:
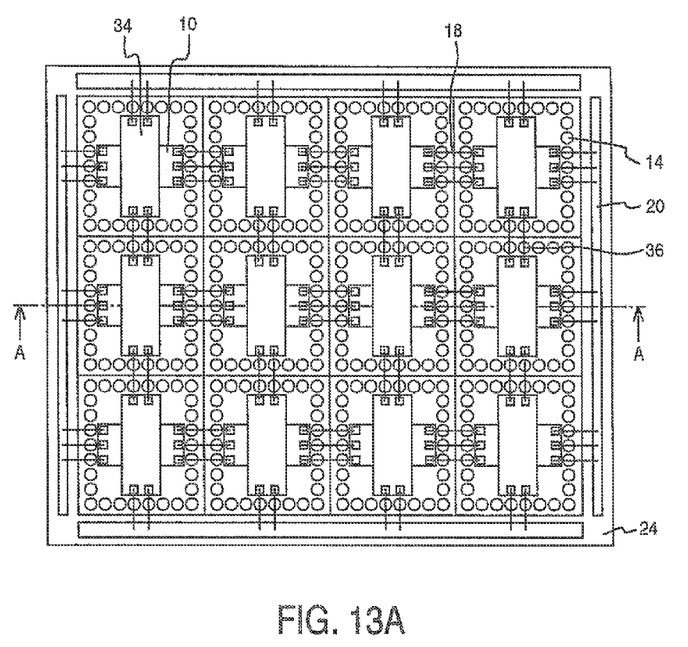
FIG. 13A is a top view (part 2) showing the method for manufacturing the semiconductor device of the third embodiment and FIG. 13B is a cross-sectional view (part 2).

Next, referencing to FIGS. 12A to 13B, a method for manufacturing the semiconductor device of the third embodiment will be described. FIGS. 12A and 13A are the top views and FIGS. 12B and 13B are cross-sectional views taken along the lines A-A in respective FIGS. 12A and 13B.

As the processes up to mounting the first semiconductor chip 10 are the same as those of the first embodiment and are shown in FIGS. 2A to 4B, their descriptions are omitted. In reference to FIGS. 12A and 12B, on the plurality of semiconductor chips 10, the second semiconductor chips 34 are respectively mounted.

Figure 13B:
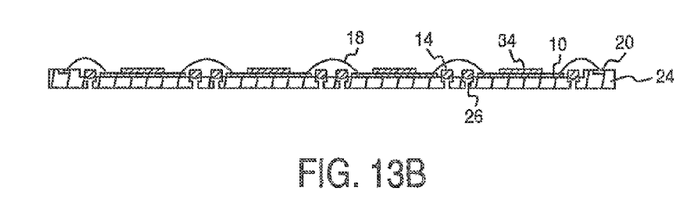

In reference to FIGS. 13A and 13B, the adjacent first semiconductor chips 10 and the adjacent second semiconductor chips 34 are, over the first metal 14, electrically coupled to each other with the first wire 18 and the second wire 36. The first semiconductor chip 10 and the second semiconductor chip 34 which are mounted in the circumference of the first support 24 and adjacent to the first conductor 20 and the first conductor 20 are coupled, over the first metal 14, with the first wire 18 and the second wire 36. Consequently; the second semiconductor chip 34 in the outermost circumference can also be coupled with the second wire 36 and, thus, becomes usable.

As the process of joining the first support 24 and the second support 30 together, the process of forming the resin 12, the process of peeling off the first support 24 and the second support 30 front the resin 12, and the process of cutting off the resin 12 are the same as those of the first embodiment and are shown in FIGS. 6A to 8B, their descriptions are omitted. Furthermore, in the process of joining the first support 24 and the second support 30 together, the first metal 14 and the second metal 16 are coupled to each other so as to also sandwich the second wire 36.

According to the method for manufacturing the semiconductor device of the third embodiment, by merely adding the process of mounting the second semiconductor chip 34 on the first semiconductor chip 10 as shown in FIGS. 12A and 12B and the process of coupling the adjacent second semiconductor chips 34 to each other with the second wire 36 over the first metal 14 as shown in FIGS. 13A and 13B, the semiconductor device having a packaging density of twice as high compared with the semiconductor device of the first embodiment can be made.

Furthermore, in the third embodiment, as shown in FIG. 9, via the second conductor 32, the adjacent first semiconductor chips 10 and the adjacent second semiconductor chips 34 can be coupled to each other, over the first metal 14, with the first wire 18 and the second wire 36. Consequently, even when wiring patterns of the adjacent second semiconductor chips 34 are different from each other, via the second conductor 32, the coupling with the second wire 36 can be easily carried out. Further, as shown in FIG. 10, the semiconductor device of the third embodiment may also be stacked.

Now, several aspects of the present invention are summarized.

A semiconductor device according to a first aspect of the present invention includes: a first semiconductor chip molded with a resin; a first metal provided in the resin in a circumference of the first semiconductor chip, and being exposed on a lower surface of the resin; a second metal provided in the resin over the first metal, and being exposed on an upper surface of the resin; and a first wire coupling the first semiconductor chip to the first metal and the second metal. The first wire is coupled to the first metal and the second metal so as to be sandwiched therebetween. According to this aspect of the present invention, a semiconductor device having a first semiconductor chip packaged can be made without using lead frames or wiring substrates. Accordingly; a cost reduction of a semiconductor device can be promoted.

In this arrangement, the first metal and the second metal may be in a spherical shape.

In this arrangement, the semiconductor device may also include: a second semiconductor chip provided on the first semiconductor chip, and molded with the resin; and a second wire coupling the second semiconductor chip to the first metal and the second metal. The second wire may be coupled to the first metal and the second metal so as to be sandwiched therebetween. With this arrangement, a semiconductor device having a first semiconductor chip and a second semiconductor chip packaged can be made without using lead frames or wiring substrates. Accordingly, a cost reduction of a semiconductor device can be further promoted.

A method for manufacturing a semiconductor device according to a second aspect of the present invention includes: forming a plurality of first metals on a first support; mounting a plurality of first semiconductor chips on the first support so as to be adjacent to some of the plurality of first metals; coupling adjacent first semiconductor chips among the plurality of first semiconductor chips to each other with a first wire over the first metals; forming a plurality of second metals on a second support; joining the first support and the second support by respectively coupling the plurality of first metals and the plurality of second metals to each other so as to sandwich the first wire; forming a resin that molds the plurality of first semiconductor chips by filling an area between the first support and the second support with resin; peeling off the first support and the second support from the resin; and cutting the resin so as to include the first semiconductor chip. According to this aspect of the present invention, a semiconductor device having a first semiconductor chip packaged can be made without using lead frames or wiring substrates. Accordingly; a cost reduction of a semiconductor device can be promoted.

In this method, the forming of the plurality of first metals may be forming the plurality of first metals by pressing the first metals into a plurality of recesses provided on the first support; and the forming of the plurality of second metals may be forming the plurality of second metals by pressing the second metals into a plurality of recesses provided on the second support. With this method, the first metals and the second metals can be sufficiently exposed on the resin. Also, the first metals and the second metals can be securely fixed on the first support and the second support.

This method may also include: planarizing a top part of the plurality of first metals prior to the coupling of the adjacent first semiconductor chips to each other with the first wire over the first metals; and planarizing a top part of the plurality of second metals prior to the joining of the first support and the second support. With this method, flat areas of the first metals and the second metals can be increased. Therefore, the first metals and the second metals can be easily coupled to each other sandwiching the first wire.

In this method, the forming of the plurality of first metals may be forming the plurality of first metals on the first support so as to sandwich the first film; and the forming of the plurality of second metals may be forming the plurality of second metals on the second support so as to sandwich the second film. With this method, the first support and the second support can be easily peeled off from the resin.

In this method, the first support may include a first through-hole which runs through the first support; the second support may include a second through-hole which runs through the second support; and the peeling off of the first support and the second support from the resin may be peeling off the first support and the second support from the resin by pumping in air through the first through-hole and the second through-hole. With this method, the first support and the second support can be easily peeled off from the resin.

In this method, the forming of the plurality of first metals may be forming the plurality of first metals on the first support so as to sandwich a first film; the forming of the plurality of second metals may be forming the plurality of second metals on the second support so as to sandwich a second film; the first support may include a first through-hole having a diameter smaller than the thickness of the first film, and which runs through the first support; the second support may include a second through-hole having a diameter smaller than the thickness of the second film, and which runs through the second support; and the peeling off the first support and the second support from the resin is peeling off of the first support and the second support from the resin by pumping in air through the first through-hole and the second through-hole. With this method, it is possible to prevent the film from creeping into the through-hole and clogging the through-hole. Accordingly the first support and the second support can be easily peeled off from the resin.

This method may also include: forming a first conductor in a circumference of the first support; and coupling the first semiconductor chips adjacent to the first conductor to the first conductor with the first wire over the first metals. With this method, the semiconductor chips mounted in an outermost circumference of the first support out of the plurality of first semiconductor chips mounted can be coupled with the first wire.

This method may also include forming a second conductor in between the adjacent first semiconductor chips. The coupling of the adjacent first semiconductor chips to each other with the first wire over the first metals may also include coupling the adjacent first semiconductor chips to each other with the first wire over the first metals via the second conductor. With this method, even when the adjacent first semiconductor chips have different wiring patterns, the adjacent first semiconductor chips can be easily coupled to each other with the first wire.

In this method, the first metals and the second metals may be in a spherical shape.

This method may also include: mounting a plurality of second semiconductor chips respectively on the plurality of first semiconductor chips; and coupling adjacent second semiconductor chips to each other with a second wire over the first metals. The joining of the first support and the second support may be joining the first support and the second support by coupling the plurality of first metals and the plurality of second metals so as to sandwich the first wire and the second wire, respectively. With this method, a semiconductor device having a first semiconductor chip and a second semiconductor chip packaged can be made without using lead frames or wiring substrates. Accordingly; a cost reduction of a semiconductor device can be further promoted.

This method may also include: forming a first conductor in the circumference of the first support; and coupling the second semiconductor chips adjacent to the first conductor to the first conductor with the second wire over the first metals. With this method, the second semiconductor chips mounted in the outermost circumference of the first support out of the plurality of second semiconductor chips mounted can be coupled with the second wire.

This method may also include forming a second conductor between the adjacent first semiconductor chips. The coupling of the adjacent second semiconductor chips to each other with the second wire over the first metals may be coupling the adjacent second semiconductor chips to each other with the second wire over the first metals via the second conductor. With this method, even when the adjacent second semiconductor chips have different wiring patterns, the adjacent second semiconductor chips can be easily coupled to each other with the second wire.

According to some aspects of the present invention, a semiconductor device having a semiconductor chip packaged can be made without using lead frames or wiring substrates. Consequently, a cost reduction of a semiconductor device can be promoted.

While the preferred embodiments of the present invention have been described in details above, the invention is not limited to those specific embodiments and, within the spirit and scope of the invention as defined in the appended claims, various modifications and alterations may be made.

We claim:

1. A semiconductor device comprising:
   a first semiconductor chip molded with a resin;
   a plurality of first metals provided in the resin in a circumference of the first semiconductor chip, and being exposed on a lower surface of the resin;
   a plurality of second metals provided in the resin over the plurality of first metals, and being exposed on an upper surface of the resin, wherein the plurality of first metals and the plurality of second metals are in spherical shapes;
   a first wire coupling the first semiconductor chip to a first one of the pluralities of first metals and second metals; wherein the first wire is coupled to the first one of the pluralities of first metals and second metals so as to be sandwiched therebetween;
   a second semiconductor chip provided directly on the first semiconductor chip, and molded with the resin; and
   a second wire coupling the second semiconductor chip to a second one of the pluralities of first metals and second metals; wherein the second wire is coupled to the second one of the pluralities of first metals and second metals so as to be sandwiched therebetween.

2. The semiconductor device according to claim 1 further comprising a plurality of first semiconductor chips and a plurality of second semiconductor chips, wherein adjacent first semiconductor chips of the plurality of first semiconductor chips are coupled to each other with a plurality of respective first wires, and wherein adjacent second semiconductor chips of the plurality of second semiconductor chips are coupled to each other with a plurality of respective second wires.

3. The semiconductor device according to claim 2 further comprising a first conductor between adjacent first semiconductor chips and a second conductor between adjacent second semiconductor chips, the adjacent first semiconductor chips coupled to each other with the plurality of respective first wires via the first conductor, and the adjacent second semiconductor chips coupled to each other with the plurality of respective second wires via the second conductor.

4. The semiconductor device according to claim 1, wherein the resin is an epoxy resin.

5. The semiconductor device according to claim 1, wherein the pluralities of first metals and second metals each comprise copper plated with gold.

6. The semiconductor device according to claim 1, wherein the first wire comprises gold.

7. The semiconductor device according to claim 1 further comprising a plurality of second semiconductor chips provided on a plurality of first semiconductor chips, wherein adjacent first semiconductor chips of the plurality of first semiconductor chips are coupled to each other with a plurality of respective first wires, and wherein adjacent second semiconductor chips of the plurality of second semiconductor chips are coupled to each other with a plurality of respective second wires.

8. The semiconductor device according to claim 7 further comprising a first conductor between adjacent first semiconductor chips and a second conductor between adjacent second semiconductor chips, the adjacent first semiconductor chips coupled to each other with the plurality of respective first wires via the first conductor and the adjacent second semiconductor chips coupled to each other with the plurality of respective second wires via the second conductor.

9. A semiconductor device comprising:
   a first semiconductor chip molded with a first resin and a second semiconductor chip molded with a second resin;
   a first metal provided in the first resin in a circumference of the first semiconductor chip, and being exposed on a lower surface of the first resin;
   a second metal provided in the second resin in a circumference of the second semiconductor chip, and being exposed on a lower surface of the second resin;
   a third metal provided in the first resin over the first metal, and being exposed on an upper surface of the first resin;
   a fourth metal provided in the second resin over the second metal, and being exposed on an upper surface of the second resin, wherein the first metal, second metal, third metal, and fourth metal are in spherical shapes;
   a first wire coupling the first semiconductor chip to the first metal and the third metal, wherein the first wire is coupled to the first metal and the third metal so as to be directly sandwiched therebetween; and
   a second wire coupling the second semiconductor chip to the second metal and the fourth metal, wherein the second wire is coupled to the second metal and the fourth metal so as to be directly sandwiched therebetween, wherein the first semiconductor chip molded with the first resin and the second semiconductor chip molded with the second resin are in a stacked configuration with the second metal of the second semiconductor chip coupled to the third metal of the first semiconductor chip via a solder layer.

10. The semiconductor device according to claim 9, further comprising:
    a third semiconductor chip provided on the first semiconductor chip, and molded with the first resin; and
    a third wire coupling the third semiconductor chip to the first metal and the third metal, wherein the third wire is coupled to the first metal and the third metal so as to be sandwiched therebetween.

11. The semiconductor device according to claim 9, further comprising:
    a fourth semiconductor chip provided on the second semiconductor chip, and molded with the second resin; and
    a fourth wire coupling the fourth semiconductor chip to the second metal and the fourth metal, wherein the fourth wire is coupled to the second metal and the fourth metal so as to be sandwiched therebetween.

* * * * *